United States Patent [19]

Balch et al.

[11] Patent Number: 5,239,696
[45] Date of Patent: Aug. 24, 1993

[54] LINEAR POWER AMPLIFIER UTILIZING CURRENT FEEDBACK

[75] Inventors: Brent F. Balch, Fort Lauderdale, Fla.; David Roberson, Forest, Va.

[73] Assignee: Sensormatic Electronics Corporation, Deerfield Beach, Fla.

[21] Appl. No.: 778,461

[22] Filed: Oct. 15, 1991

[51] Int. Cl.$^5$ .............................................. H04B 1/04
[52] U.S. Cl. ..................................... 455/127; 340/572; 455/41; 455/121
[58] Field of Search ............... 455/114, 121, 125, 126, 455/127, 123, 41; 340/572, 551

[56] References Cited

U.S. PATENT DOCUMENTS

| | | | |
|---|---|---|---|
| 4,097,687 | 6/1978 | Yamaguchi | 375/18 |
| 4,658,241 | 4/1987 | Torre | 340/572 |
| 4,859,991 | 8/1989 | Watkins et al. | 340/572 |
| 5,081,713 | 1/1992 | Miyazaki | 455/126 |

Primary Examiner—James L. Dwyer
Assistant Examiner—Philip J. Sobutka
Attorney, Agent, or Firm—Robin, Blecker, Daley & Driscoll

[57] ABSTRACT

A transmitter for an electronic article surveillance system having a power amplifier for forming a drive signal for causing a current to flow through an antenna. The magnitude of the current flowing through the antenna is sensed and, based upon the sensed current, the drive signal is continuously controlled.

18 Claims, 2 Drawing Sheets

LINEAR POWER AMPLIFIER UTILIZING CURRENT FEEDBACK

FIELD OF THE INVENTION

This invention relates to a transmitter for forming a pulsed radiated magnetic field in an electronic article surveillance (EAS) system and, in particular, to an EAS system transmitter which advantageously controls the characteristics of the pulsed radiated magnetic field.

BACKGROUND OF THE INVENTION

Electronic article surveillance (EAS) systems are known in which a transmitter radiates a pulsed magnetic field into a surveillance area. When an article having an attached system tag is positioned within the surveillance area, the radiated magnetic field excites the tag, causing the tag to generate a detectable response signal. A receiver, which is enabled while the pulsed radiated magnetic field is turned off, detects the tag's response signal and initiates an appropriate action.

In a typical EAS transmitter the pulsed magnetic field is generated by periodically driving an antenna with a square wave having a frequency which defines a desired operating frequency for the system. The square wave comprises the output voltage of a switching power amplifier, and the antenna has resistive-inductive-capacitive (R-L-C) components that are appropriately selected to permit the antenna to resonate at the desired operating frequency. This maximizes the current flowing through the antenna which, in turn, maximizes the amplitude of the radiated magnetic field.

In order to permit currents on the order of a few amps to flow through the antenna, the values of the R-L-C components must be selected so that the antenna has a very large Q factor. To obtain such a large Q, tight control of the absolute value of the R-L-C components is required. For example, in an antenna where the inductance L and resistance R are fixed values, governed by the geometry of the antenna coils, the total capacitance C must be accurate to within a 1% to 2% tolerance. This is usually achieved using precision capacitors or a trimming capacitor, thereby adding cost to the production of the transmitter. Further, an antenna having such a high Q limits the radiated magnetic field to a very narrow range of frequencies surrounding the resonant frequency of the antenna, thereby preventing multifrequency operation of the system.

A further problem with a transmitter of the above-type is that the inductance value L changes based upon external conditions. For example, moving a large metal object into the radiated magnetic field has the effect of changing the inductance value L of the antenna. This change in inductance value shifts the resonant frequency and Q of the antenna which causes the current flowing through the antenna to be reduced. The reduced current flow decreases the magnitude of the radiated magnetic field and, therefore, reduces the effectiveness of the EAS system.

Another disadvantage of the known EAS transmitter is that the R-L-C components of the antenna form a two pole filter which provides only a −6 db/octave filtering of the transmitter drive signal. This magnitude of filtering may not reduce the harmonic content of the radiated magnetic field to a level sufficient to meet all regulatory requirements. Adding additional R-L-C components to the antenna is one technique which provides additional filtering. However, the added R-L-C components create problems of power dissipation, as the components must carry the large currents which are passed through the antenna. Further, the introduction of additional R-L-C components greatly increases the rise and fall times of the envelope of the radiated magnetic field when the field is cycled on and off.

It is also desired in the known EAS transmitters to be able to control the rise and fall times of the envelope of the radiated magnetic field. This control must be effected in a manner to satisfy competing requirements. One requirement necessitates a relatively short fall time for the envelope so that the falling edge of the envelope does not interfere with the receipt of the maximum tag response occurring immediately after the transmitter is turned off. A second requirement necessitates a longer fall time, as well as a relatively long rise time, so as to limit the harmonics usually generated by sharp edges, i.e., rapid rise and fall times, of the envelope. In present EAS transmitters, there is no mechanism for optimally satisfying these competing requirements.

It is therefore an object of the present invention to provide a transmitter for an EAS system which forms a pulsed radiated magnetic field which is not adversely effected by changes in the characteristics of the antenna;

It is a further object of the present invention to provide a transmitter for an EAS system which forms a pulsed radiated magnetic field having a reduced harmonic content; and It is yet a further object of the present invention to provide a transmitter for an EAS system which forms a pulsed radiated magnetic field having an envelope with predetermined rise and fall time characteristics.

SUMMARY OF THE INVENTION

In accordance with the principles of the present invention, the above and other objectives are realized in a transmitter for an EAS system in which the transmitter comprises an antenna means and a drive means which forms a drive signal for the antenna means. A current sensing means continuously senses the magnitude of the current flowing through the antenna means as a result of the drive signal and based upon the sensed current, control means then continuously controls the drive means to appropriately change the drive signal. In this way, the current flowing in the antenna means is continuously controlled, during all phases of driving the antenna means, so as not to be adversely affected by changes in the characteristics of the antenna.

Also disclosed is an EAS transmitter as described above, further comprising a means for generating a predetermined wave-form. The drive signal is then continuously controlled so that the current flowing in the antenna means is linearly proportional to the predetermined wave-form.

In the disclosed embodiment, the predetermined wave-form is generated by using a switching means to gate a sine-wave, and then by using a shaping means to shape the envelope of the sine-wave. A power amplifier fed by the output of the control means is used to generate the antenna driving signal. The control means output comprises an error signal formed by a summing amplifier which sums the predetermined wave-form and an opposite polarity signal indicative of the sensed current flowing through the antenna.

This causes the drive signal output of the power amplifier to be set at a voltage such that the current flowing through the antenna is linearly proportional to the predetermined wave-form and substantially unaffected by changes in the antenna characteristics. Accordingly, controlling the characteristics of the predetermined wave-form effectively controls the characteristic of the current flowing in the antenna means.

BRIEF DESCRIPTION OF THE DRAWINGS

The above and other features and aspects of the present invention will become more apparent upon reading the following detailed description in conjunction with the accompanying drawings in which.

DETAILED DESCRIPTION

Figure 1:
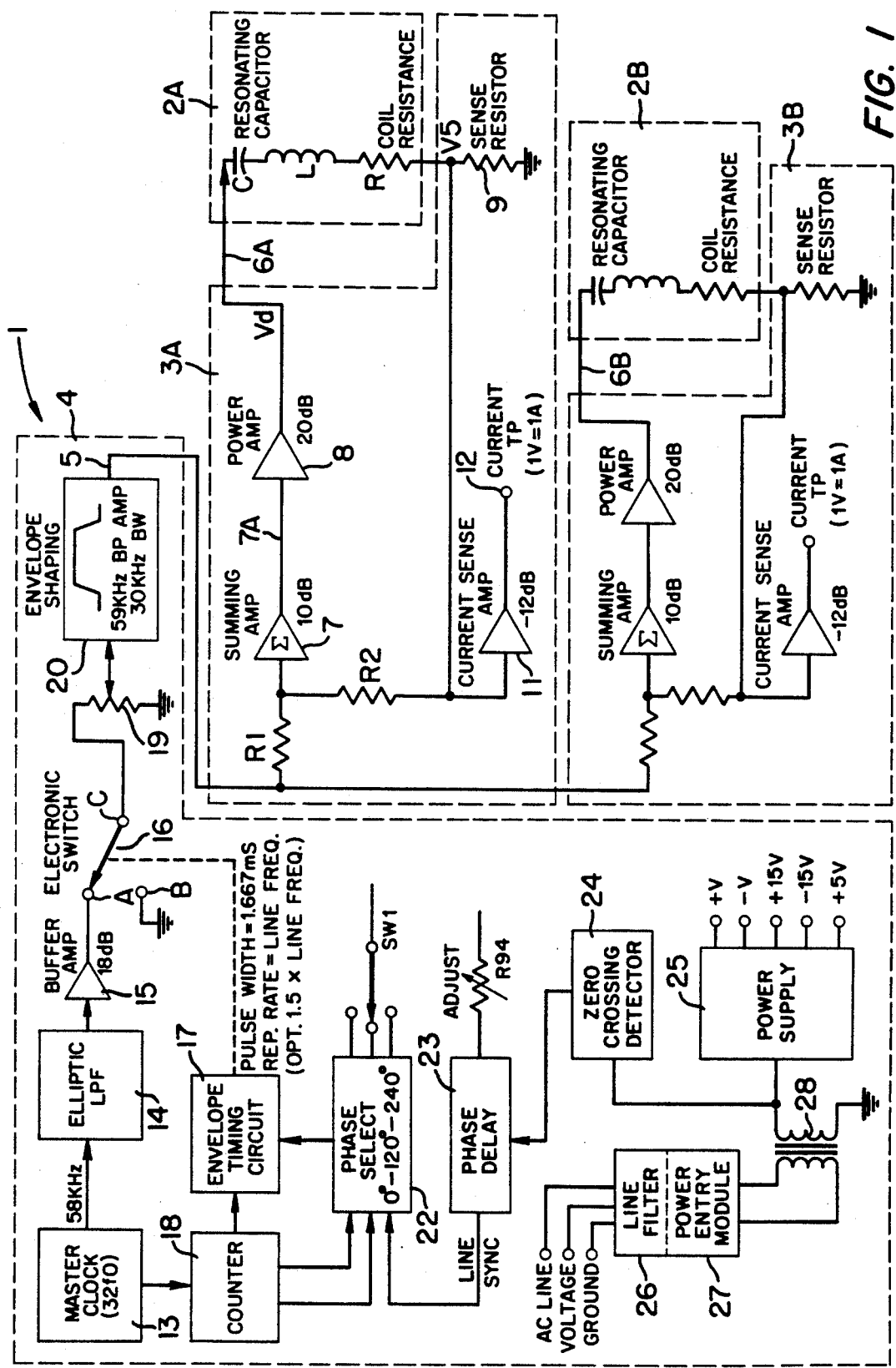
FIG. 1 shows a block diagram of a transmitter for an EAS system in accordance with the principles of the present invention.

FIG. 1 shows an EAS system transmitter 1 in accordance with the principles of the present invention. As illustrated, the transmitter 1 comprises a low voltage section 4 which generates a low voltage signal 5 which is coupled to the inputs of amplifier sections 3A and 3B. Amplifier sections 3A and 3B, in turn, drive resonant antennas 2A and 2B, respectively.

Amplifier section 3A and resonant antenna 2A are identical in all respects to amplifier section 3B and resonant antenna 2B, respectively. Accordingly, the following is a description of the amplifier section 3A and resonant antenna 2A with the understanding that the description is equally applicable to amplifier section 3B and antenna 2B.

The amplifier section 3A generates a voltage drive signal $V_D$ which causes a current 6A to flow in the antenna 2A. The current 6A in the antenna 2A causes the antenna to radiate a magnetic field.

As shown, the antenna 2A comprises a coil of wire having a series resistance R and a series inductance value L. A series resonating capacitor C is connected in series with the antenna 2A and is selected to have a capacitance value which tunes the antenna to resonate at a predetermined system operating frequency f1. The series resistance R of the antenna includes the resistance of the coil and may also include cable and connector losses.

Tuning the antenna 2A to resonate at the predetermined operating frequency f1 allows the current 6A in the antenna to be maximum when the drive signal from amplifier section 3A is at that frequency. By maximizing the current 6A, the radiated magnetic field formed thereby is also maximized.

It should be noted that the tuned antenna 2A, particularly if tuned to have a high Q value, is easily de-tuned by external conditions. For example, when a large metal object is placed in the antenna's radiated magnetic field, the inductance value L of the antenna is changed, thereby changing the resonant frequency of the antenna. Further, tolerance errors in the R-L-C components, or drift in the capacitive value of the series resonating capacitor C as a function of temperature or time, also tend to change the resonant frequency and/or Q of the antenna. Such changes in the resonant frequency and/or Q of the antenna result in the current 6A flowing through the antenna being reduced for a given level of the drive signal from the section 3A, causing a corresponding reduction in the radiated magnetic field.

In accordance with the invention, the amplifier section 3A is adapted to provide through current feedback a drive signal which results in the current 6A remaining substantially constant in spite of changes in the antenna characteristics. In this way, the radiated magnetic field formed by the antenna 2A also is not affected by such changes.

The amplifier section 3A comprises a summing amplifier 7 having an output connected to the input of a power amplifier 8. The output of the power amplifier 8 forms the drive voltage $V_d$. This voltage causes the current 6A to flow through the resonant antenna 2A and through a sense resistor 9 to circuit ground. The power amplifier 8 is selected to be a very low distortion, wide bandwidth, non-inverting amplifier having a gain of approximately 20 db. The input impedance of the power amplifier 8 is selected to be very high and the output impedance very low. Circuits for implementing a power amplifier having these characteristics are well known in the art and, therefore, further detailed discussion thereof is unnecessary.

The sense resistor 9 generates a sense voltage $V_s$ which is proportional to the driving current 6A. Accordingly, a reduction in the magnitude of the drive current 6A passing through the antenna 2A, due to changes in the characteristics of the antenna 2A, is reflected as a reduction in the sense voltage $V_s$.

The summing amplifier 7 is an inverting amplifier which receives the sense voltage $V_s$ through resistor R2, and sums this voltage with the low voltage signal 5 received through resistor R1. The latter voltage is of opposite polarity to the sense voltage $V_s$, so that the sum signal output from the amplifier 7 comprises an error signal 7A indicative of the difference between these voltages.

When the impedance of the antenna 2A increases (i.e., decreased Q or a shift in the resonant frequency), the resulting reduction in the current 6A causes the sense voltage $V_s$ to drop. The summing amplifier 7, responsive to this drop in the sense voltage $V_s$, increases its error signal output 7A, thereby causing the drive voltage $V_d$ from the power amplifier 8 to increase. Conversely, when the impedance of the antenna decreases, the resulting increase in drive current 6A passing through the antenna 2A causes the sense voltage $V_s$ to increase. The summing amplifier 7, responsive to this increase in the sense voltage $V_s$, decreases its error signal output 7A, thereby causing the drive voltage $V_d$ from the power amplifier 8 to decrease.

As can be appreciated from the above description, by utilizing a sense voltage $V_s$ indicative of the current 6A passing through the antenna 2A, the drive voltage $V_d$ is continuously adjusted so that the current 6A is made to be linearly proportional to the low voltage signal 5. This occurs regardless of any changes in the characteristics of the antenna 2A.

It should be noted that the maximum level of the drive voltage $V_d$ determine the extent of antenna characteristic changes for which the current 6A will continue to linearly follow the low voltage signal 5.

As described above, amplifier section 3A provides a current 6A which is linearly related to the low voltage signal 5 generated by the low voltage section 4. In accordance with the principles of the present invention, the low voltage section 4 is adapted such that the low voltage signal 5 formed is nearly sinusoidal at the predetermined operating frequency f1 and is gated or pulsed on and off at a low-duty-cycle. The low voltage section 4 is further adapted so that the rise and fall times of the envelope of the gated signal can be selectively controlled.

The low voltage section 4 comprises a master clock 13 having a crystal oscillator (not shown) which runs at thirty-two times the frequency f1 of the low voltage signal 5. A divide-by-thirty-two counter (not shown) divides this signal by thirty-two, to form a square-wave at the frequency f1. For example, in an EAS system in which the frequency f1 might typically be 58 KHz, the crystal oscillator frequency would be 1.856 MHz.

The square-wave signal from the divide-by-thirty-two counter of the master clock 13 is supplied to a filter 14 which attenuates the harmonic frequencies contained therein. A variety of harmonic filters can be used for the filter 14. A typical harmonic filter might be an elliptic filter.

Figure 2:
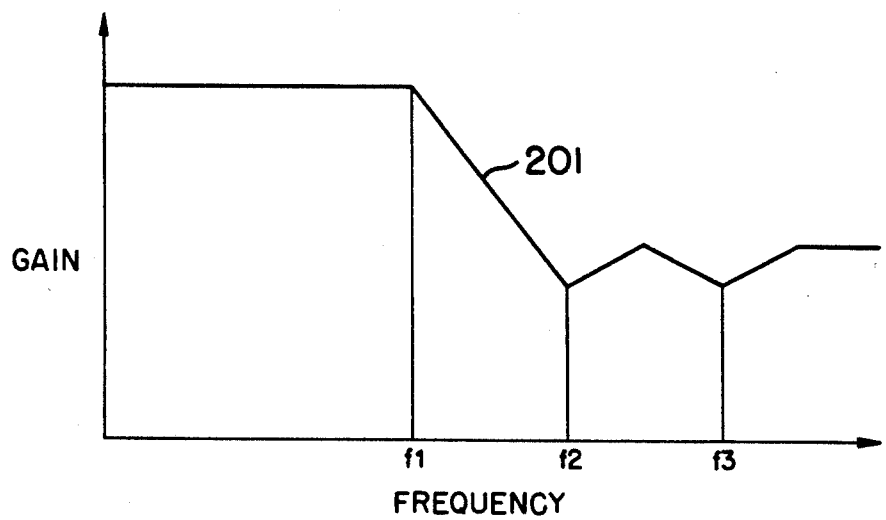
FIG. 2 illustrates the attenuation versus frequency characteristic of the elliptic low-pass filter of the transmitter of FIG. 1.

FIG. 2 is a graph illustrating a typical low pass attenuation characteristic for such an elliptic filter. In FIG. 2, the ordinate of the graph represents the gain of the filter and the abscissa represents the frequency of the square-wave signal input to the filter. As shown, the filter 14 is a fifth-order filter which provides a segment 201 having a very steep roll-off for frequencies above the frequency f1. The filter also provides extra attenuation at the second harmonic f2 and at the third harmonic f3 of this frequency. Accordingly, by having this extra attenuation, the signal output from the filter is a very high purity sine wave at the system's operating frequency f1.

Integrated-circuits for implementing the elliptic low-pass filter described in FIG. 2, using a minimal number of external components, are well known. Therefore, further description of the details of the filter have been omitted.

A buffer amplifier 15 having approximately 16 db gain, amplifies the sine-wave signal generated by the filter 14. The output of the buffer amplifier 15, which is a sine-wave having a peak voltage of approximately ten volts, is applied to an input A of an electronic switch 16. Input B of the electronic switch 16 is connected to system ground. The output C of the electronic switch 16 is selectively connected, under control of an envelope timing circuit 17, to either input A or input B of the switch.

The buffer amplifier 15 is selected to have a very high input impedance and a low output impedance. Accordingly, the elliptic low-pass filter 14 is unaffected by the fluctuating load impedance resulting from the operation of the electronic switch 16. This buffering effect assists in maintaining the purity of the sine-wave form.

Figure 3:
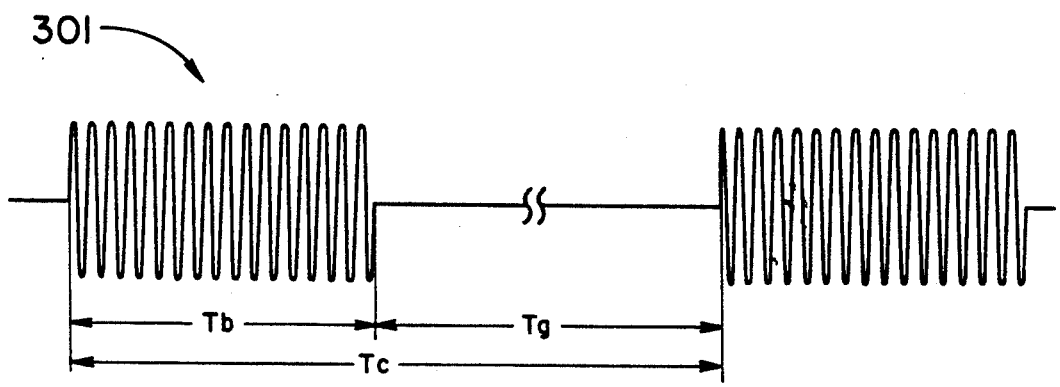
FIG. 3 illustrates the wave-form at the output of the electronic switch of the transmitter of FIG. 1.

The envelope timing circuit 17 outputs a control signal which causes the electronic switch 16 to alternate, at a low-frequency (e.g., 60 Hz), in connecting the output C of the electronic switch 16 to the switch A input and the switch B input. FIG. 3 shows the wave-form 301 at the output C of the electronic switch 16.

During a burst time period $T_b$, the switch connects its output C to its input A, thereby gating the sine-wave output at frequency f1 from the buffer amplifier 15 to the output C. As can be seen, the envelope of the sine-wave is nearly rectangular. During a second time period $T_g$, the switch connects its output C to its input B placing the output C at ground voltage. The burst time period $T_b$ is generally selected to be much shorter than the ground time period $T_g$. Accordingly, a low-duty-cycle signal having a cycle time period $T_c$ is generated.

In a typical configuration, the burst time period $T_b$ might be 1.667 mseconds, the ground time $T_g$ 15 mseconds and the cycle time period $T_c$ 16.667 mseconds. These time periods are merely illustrative and other time periods can be used. Also, it should be noted that the wave-form 301 is not drawn to scale (i.e., the number of cycles of the sine-wave and the ratio of the time periods $T_b$, $T_g$ and $T_c$ are not shown in scale.)

The output of the electronic switch 16 is coupled through a variable resistor or resistive voltage divider 19 to an envelope shaping circuit 20. The variable resistor 19 attenuates the wave-form 301 shown in FIG. 3 without affecting the characteristic of the wave-form. The envelope shaping circuit 20 is selected to be a broadband bandpass filter whose frequency characteristic is used to adjust the rise-time and fall-time of the envelope of the wave-form 301 without affecting its spectral purity.

Figure 4:
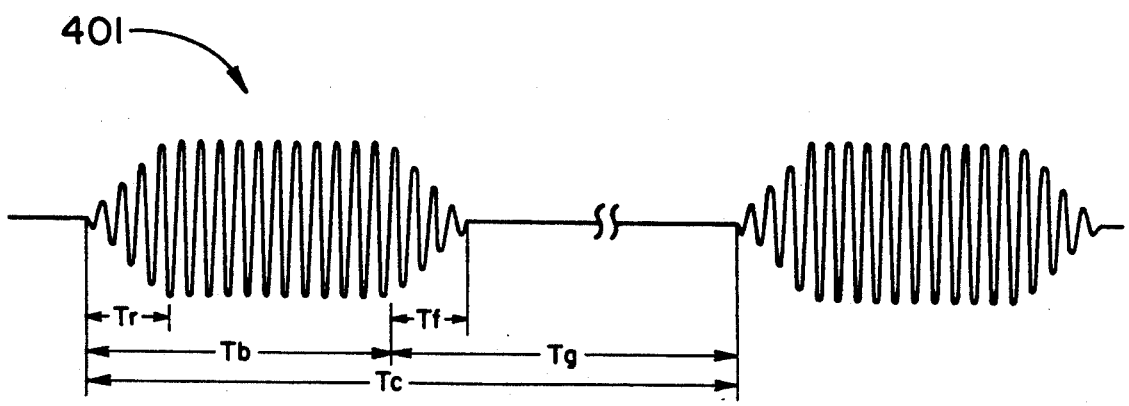
FIG. 4 illustrates the wave-form at the output of the envelope shaping circuit of the transmitter of FIG. 1.

FIG. 4 shows the wave-form 401 developed at the output of the envelope shaping circuit 20 (the low voltage signal 5 of FIG. 1). The wave-form 401 has the same burst time period $T_b$, ground time period $T_g$ and low-duty-cycle time period $T_c$ as the wave-form 301 of FIG. 3. The wave-form 401 differs from wave-form 301 in that the envelope of the sine-wave has an adjusted rise-time $T_r$ and an adjusted fall time $T_f$ resulting from the shaping circuit 20. However, the circuit has not disturbed the spectral purity of the waveform during these adjusted time periods.

The Q of the broadband bandpass filter of the circuit 20 can be changed by adjusting means (not shown). Changing the Q of the envelope circuit controls the rise-time $T_r$ and the fall-time $T_f$ of the envelope of the wave-form 401. As a result, the Q of the circuit 20 can be adjusted to best satisfy the competing requirements of a low harmonic content of the envelope (increased rise and fall times) and a rapid shut-off of the signal (decreased fall times.)

A power supply 25 receives power through a power transformer 28 and provides unregulated positive and negative voltage for the amplifier sections 3A and 3B, regulated +15 VDC and −15 VDC for the linear control circuits and +5 VDC for the logic circuits. The power transformer is a step down transformer, which converts the local line voltage to a lower level for the power supply 25. The primary of the transformer is tapped for operation at 100 VAC, 120 VAC, 220 VAC and 240 VAC, and for operation at 50 Hz or 60 Hz. The power transformer 28 receives the line voltage through a line filter 26 and a power entry module 27. The power entry module 27 comprises a main power switch (not shown) and a safety fuse (not shown). The line filter 26 prevents line conducted noise from interfering with the transmitter 1 and prevents the signals generated by transmitter 1 from being conducted to the local wiring.

The control signal output from the envelope timing circuit 17 is synchronized with the AC line voltage. The synchronism is achieved by a zero crossing detector 24, a phase delay circuit 23, a phase select circuit 22 and a counter 18. The zero crossing detector 24 comprises a non-inverting comparator which senses the AC line voltage and outputs a logic level signal corresponding to the AC line voltage zero crossings. The output of the zero crossing detector 24 is provided to the phase delay circuit 23.

The phase delay circuit 2 is adjusted by variable resistor R94 to provide a delay of up to 7 mseconds after the positive going power line zero crossing. This phase delay permits multiple transmitters (not shown), which are not electrically connected together, and which may be connected to different legs (phases) of the AC line voltage, to operate in synchronism. Further, for multiple systems, connected to the same leg of the AC line voltage, the small amount of phase error that sometimes occurs between different power outlets can be compensated. The output of the phase delay circuit 23 connects to the phase select circuit 22.

The phase select circuit 22, based upon the position of switch sw1, selectably delays the signal output from the phase delay circuit 23, by either 0°, 120° or 240°. Providing the selectable phase delays allows the burst time period to be shifted away from the zero crossing point of the AC line voltage. This avoids interference from noise (in the time domain) at the zero crossing generated from other electrical devices.

The counter 18 comprises a ripple counter which divides the frequency output of the master clock 13 down. The output of the counter is then provided to the phase select circuit 22 and the envelope timing circuit 17.

The envelope timing circuit 17 comprises two programmable counters (not shown). One counter determines the delay before the start of the burst time period $T_b$ and the other determines the duration of the burst time period $T_b$. As a jumper (not shown) selectable option, the envelope timing circuit 17 can be set to initiate the burst time period at 1.5 times the AC power-line frequency.

A current sense amplifier 11 amplifies the sense voltage $V_s$ and outputs, to a test point 12, a test voltage signal which can be monitored by a standard oscilloscope. The gain of the current sense amplifier 11 is set to provide a test voltage signal at test point 12 which equals the drive current 6A through the antenna 2A (and therefore sense resistor 9) multiplied by one volt. The current sense amplifier 11 has a very high input impedance and a low output impedance, and therefore, attaching an oscilloscope to test point 12, so as to monitor the current 6A, does not affect the characteristics of the antenna 2A.

It should be noted that while the invention has been illustrated in terms of the use of a low-duty-cycle pulsed signal for the signal 5, the principles of the invention are equally applicable to cases where a high-duty-cycle pulsed signal is used for such signal. Additionally, the principles of the invention directed to the use of the amplifier section 3A to generate a drive signal which results in an antenna current which is substantially unaffected by changes in the antenna characteristics are equally applicable to the use of low-duty-cycle and high-duty-cycle pulsed signals as well as continuous wave signals for the signal 5.

In all cases it is understood that the above-described arrangements are merely illustrative of the many possible specific embodiments which represent applications of the present invention. Numerous and varied other arrangements can readily be devised in accordance with the principles of the present invention without departing from the spirit and scope of the invention.

What is claimed is:

1. An electronic article surveillance transmitter, comprising:
   means for generating a predetermined wave-form;
   means for forming a drive signal comprising a power amplifier;
   antenna means for forming a radiated magnetic field when excited by said drive signal;
   current sensing means for sensing a current flowing through said antenna means when said antenna means is excited by said drive signal;
   control means for continuously controlling at all times when said antenna means is excited by said drive signal said means for forming said drive signal based upon said current flowing through said antenna means sensed by said current sensing means, said control means controlling said means for forming said drive signal so that the current flowing through the antenna means is linearly proportional to the predetermined wave-form and said control means comprising a summing amplifier for summing opposite polarity signals indicative of the current sensed by said current sensing means and the predetermined wave-form and providing an error signal to said power amplifier.

2. An electronic article surveillance transmitter as claimed in claim 1 wherein:
   said means for generating a predetermined wave-form comprises means for generating a sine-wave.

3. An electronic article surveillance transmitter as claimed in claim 2, wherein:
   said means for generating a predetermined wave-form further comprises switching means for gating the sine-wave generated by said means for generating a sine-wave, said switching means providing an output comprising bursts of said sine-wave, each burst having a nearly rectangular envelope.

4. An electronic article surveillance transmitter as claimed in claim 3, wherein:
   said means for generating a predetermined wave-form further comprises means for shaping the envelope of said burst of sine-wave which is output from said switching means.

5. An electronic article surveillance transmitter as claimed in claim 4, wherein:
   said means for shaping the envelope further comprises adjusting means for adjusting a rise-time and a fall-time of the envelope of said burst of said sine-wave.

6. An electronic article surveillance transmitter as claimed in claim 3 further comprising:
   envelope timing means for controlling a duty-cycle of said gating of said sine-wave by said switching means.

7. An electronic article surveillance transmitter as claimed in claim 6, wherein:
   said envelope timing means comprises synchronizing means for synchronizing said gating of said sine-wave by said switching means with a zero crossing of an external AC line voltage.

8. An electronic article surveillance transmitter as claimed in claim 7, wherein:
   said synchronizing means comprises phase selecting means for shifting a phase of said gating of said sine-wave by said switching means by a selected phase value, where the selected phase value is selected from a group of phase values corresponding to alternate phases of the external AC line voltage.

9. An electronic article surveillance transmitter as claimed in claim 8, wherein:
   said synchronizing means further comprises phase delay means for delaying the gating of said sine-wave by said switching means, whereby said phase delay means compensates for small variations in the phase of the AC line voltage.

10. An electronic article surveillance transmitter, comprising:

means for generating a predetermined wave-form including means for generating a sine-wave, said means for generating a sine-wave comprising means for generating a square-wave at a predetermined system operating frequency and filtering means for attenuating harmonics of said square wave;

means for forming a drive signal; comprising a power amplifier antenna means for forming a radiated magnetic field when excited by said drive signal;

current sensing means for sensing a current flowing through said antenna means when said antenna means is excited by said drive signal; and control means for continuously controlling at all times when said antenna means is excited by said drive signal said means for forming said drive signal based upon said current flowing through said antenna means sensed by said current sensing means, said control means controlling said means for forming said drive signal so that the current flowing through the antenna means is linearly proportional to the predetermined wave-form and said control means comprising a summing amplifier for summing opposite polarity signals indicative of the current sensed by said current sensing means and the predetermined wave-form and providing an error signal to said power amplifier.

11. An electronic article surveillance transmitter as claimed in claim 10, wherein:

said filtering means comprises a fifth order low-pass filter having a steep roll-off for frequencies above said predetermined system operating frequency.

12. An electronic article surveillance transmitter as claimed in claim 11, wherein:

said fifth order low-pass filter is configured so as to provide additional attenuation at a second harmonic of said system operating frequency and at a third harmonic of said system operating frequency.

13. A method of exciting an antenna means of an electronic article surveillance transmitter, comprising:

generating a predetermined wave-form;

forming a drive signal;

forming a radiated magnetic field by exciting the antenna means with said drive signal;

sensing a current flowing through said antenna means when the antenna means is excited by said drive signal; and controlling continuously at all times when said antenna means is excited by said drive signal said drive signal based on said sensed current flowing through said antenna means, said step of controlling continuously said drive signal causing said current flowing through said antenna means to be linearly proportional to the predetermined wave-form and comprising summing opposite polarity signals indicative of the current sensed and the predetermined wave-form to form an error signal;

and said step of forming includes applying said error signal to a power amplifier whose output forms said drive signal.

14. A method as claimed in claim 13 wherein:

said predetermined wave-form is a sine-wave.

15. A method as claimed in claim 14, wherein:

said step of generating said predetermined wave-form comprises gating said sine-wave and outputting an output comprising bursts of said sine-wave, each burst having a nearly rectangular envelope.

16. A method as claimed in claim 15, wherein:

said step of generating said predetermined wave-form further comprises shaping the envelope of said burst of sine-wave.

17. A method as claimed in claim 16 wherein:

said step of shaping the envelope further comprises adjusting a rise-time and a fall-time of the envelope of said burst of said sine-wave.

18. A method as claimed in claim 17, wherein:

said step of generating a sine-wave comprises generating a square-wave at a predetermined system operating frequency and filtering the square-wave to attenuate the harmonics of the square-wave.

* * * * *

UNITED STATES PATENT AND TRADEMARK OFFICE
CERTIFICATE OF CORRECTION

PATENT NO. : 5,239,696
DATED : August 24, 1993
INVENTOR(S) : Brent F. Balch and David Roberson It is certified that error appears in the above-indentified patent and that said Letters Patent is hereby corrected as shown below:

Col. 7, line 1.   Change "2" to -- 23 --
Col. 9, line 14.  Delete ";"
Col. 9, line 15.  After "amplifier" insert -- ; --

Signed and Sealed this

Eighth Day of March, 1994

Attest:

BRUCE LEHMAN

Attesting Officer        Commissioner of Patents and Trademarks